United States Patent [19]

Robinson

[11] Patent Number: 5,009,761
[45] Date of Patent: Apr. 23, 1991

[54] METHOD OF PRODUCING AN OPTICAL COMPONENT, AND COMPONENTS FORMED THEREBY

[75] Inventor: Dennis W. Robinson, Bradford on Avon, England

[73] Assignee: Spafax Holdings Plc., United Kingdom

[21] Appl. No.: 654,210

[22] Filed: Sep. 24, 1984

[51] Int. Cl.$^5$ ............................................. C23C 14/34
[52] U.S. Cl. .................. 204/192.14; 204/192.26; 204/192.27; 427/126.3; 427/164
[58] Field of Search ......... 204/192 R, 192 C, 192 SP, 204/192 P; 427/39, 126.2, 26.2, 255, 126.3, 164; 350/641; 428/416, 417, 432, 469

[56] References Cited

U.S. PATENT DOCUMENTS

| | | | |
|---|---|---|---|
| 3,530,055 | 9/1970 | Maissel | 204/192 R |
| 3,694,337 | 9/1972 | Kushihashi et al. | 204/192 P |
| 3,715,244 | 2/1973 | Szupillo | 204/192 P |
| 4,022,947 | 5/1977 | Grubb et al. | 428/469 |
| 4,028,206 | 6/1977 | King | 204/192 P |
| 4,096,026 | 6/1978 | Takeuchi | 204/192 P |
| 4,098,956 | 7/1978 | Blickensderfer et al. | 204/192 P |
| 4,101,200 | 7/1978 | Daxinger | 204/192 P |
| 4,139,443 | 2/1979 | Sakurai | 204/192 P |
| 4,142,958 | 3/1979 | Wei et al. | 204/192 P |
| 4,322,276 | 3/1982 | Meckel et al. | 204/192 P |
| 4,337,990 | 7/1982 | Fan et al. | 204/192 P |
| 4,411,972 | 10/1983 | Narken et al. | 428/432 |
| 4,421,622 | 12/1983 | Hollars | 204/192 P |
| 4,450,201 | 5/1984 | Brill et al. | 428/469 |
| 4,462,883 | 7/1984 | Hart | 204/192 P |
| 4,510,190 | 4/1985 | Gläser | 204/192 P |

FOREIGN PATENT DOCUMENTS

| | | | |
|---|---|---|---|
| 0011742 | 6/1980 | European Pat. Off. | 204/192 R |
| 1002584 | 2/1957 | Fed. Rep. of Germany | 204/192 R |
| 2833133 | 2/1980 | Fed. Rep. of Germany | 204/192 R |
| 3017713 | 11/1981 | Fed. Rep. of Germany | 204/182 R |
| 2051774 | 9/1971 | France | 204/192 R |
| 0175847 | 10/1982 | Japan | 204/192 P |
| 1011977 | 12/1965 | United Kingdom | 204/192 R |
| 2126256 | 3/1984 | United Kingdom | 428/469 |

Primary Examiner—Nam X. Nguyen
Attorney, Agent, or Firm—Lucas & Just

[57] ABSTRACT

A method of making an optical component having specular reflective properties from plastics material comprising applying to the plastics material a face layer of hard glass or a substance having hard glasslike properties and subsequently applying to the face layer a coating of specular reflective material.

14 Claims, No Drawings

METHOD OF PRODUCING AN OPTICAL COMPONENT, AND COMPONENTS FORMED THEREBY

This invention relates to a method of producing an optical component and components produced thereby.

It is known to use synthetic plastics materials for optical components and these have several advantages over traditional glass and crystalline materials, such as resistance to thermal and mechanical shocks, lower production costs, reduced weight and greater design flexibility. Such plastics optical components are however, vulnerable to surface damage by abrasion, scratching and environmental conditions which often impair their function.

It is known that transparent scratch resistant layers may be deposited on to plastics material surfaces by dipcoating, ultra violet polymerisation and varnishing. Additional processing and end product problems are created, such as lack of thickness uniformity, variable adhesion to the plastic sub-strate gel formation on curing the coating and it is also generally expensive to produce at commercially acceptable efficiencies. The coating can be very specific to a particular plastic and deposition directly over metallic reflective finishes on the plastics material can present many problems.

There are many optical applications where it is required to produce an abrasion-resistant specular reflective finish on plastics material substrates.

This can be achieved in a number of ways including electro-chemical deposition of a hard reflective metal such as chromium or nickel onto the front surface of a clear or opaque plastics material, usually acrylonitrile-butadiene-styrene copolymers. This method is very costly and prone to production problems. It also produces a mirror-like product of lower reflectivity than is achieved by conventional silver or aluminium surfaces. Despite the use of a relatively inert plastics base material for the mirror the multi-metal layer electroplating process can also give rise to troublesome electrolytic corrosion problems when the mirror is exposed to adverse environmental conditions. A further technique involves thermal evaporation of aluminium on to the rear surface of an already coated transparent plastics material, the coating of which is abrasion resistant to a degree and previously deposited by a separate and costly wet chemical process. Articles produced by this technique are limited by the size, shape and configuration of the basic coated plastics materials, usually in flat-sheet form, and are expensive by virtue of the multi-stage production methods involved.

Vacuum assisted metal deposition onto untreated plastics material followed by a wet chemical coating process to confer abrasion resistance is also known but this is again costly and prone to optical faults.

It is an object of the present invention to overcome the above drawbacks.

According to one aspect of the present invention a method of making an optical component having specular reflective properties from plastics material comprises applying to the plastics material a face layer of hard glass or a substance having hard glass-like properties and subsequently applying to the face layer a coating of specular reflective material.

The plastics material is preferably subject to a degreasing operation prior to applying the face layer, and the degreasing operation may be carried out by subjecting the plastics material to vapour degreasing in a fluorocarbon solvent and the material is then transferred to an ultra-sonically vibrated solution of the same solvent.

Preferably also a molecular cleaning operation is performed in a vacuum vessel after the degreasing operation. Subsequently the face layer may be formed by applying a key coat layer of oxides of the material used for the specular reflective material. The key coat layer may be applied by means of a magnetron sputtering operation in a vacuum vessel in an atmosphere of oxygen and argon at a pressure in the region of $2 \times 10^{-3}$ mbar.

Immediately after the molecular cleaning operation the vacuum vessel may be reduced to $1 \times 10^{-5}$ mbar pressure and argon gas is introduced until the pressure reaches $5 \times 10^{-4}$ mbar, oxygen then being added until the pressure has risen to $2 \times 10^{-3}$ mbar.

The key coat is immediately applied by means of a magnetron sputtering operation using a target of the metal to be deposited on the key coat layer. The key coat layer is preferably of the order of 0.5–1.0 microns thick.

The coating of reflective material may then be applied directly to the key coat layer and in this case the reflective material may be applied by a DC magnetron sputtering operation.

In one arrangement the coating of specular reflective material is chromium, and in which case the key coat layer is preferably a thin layer of oxides of chromium of between 0.5 to 1.0 microns thick.

In an alternative arrangement the coating of specular reflective material is aluminium, in which case the key coat layer is preferably a thin layer of oxides of aluminium of between 0.5 and 1.0 microns thick. In the latter case a hard abrasive resistant coat may also be applied to the aluminium, and in this case a top coat may be applied by means of a layer of dielectric oxide of between 0.5 and 5.0 microns thick.

In another alternative according to the invention the face layer may be formed by an in situ glass making operation by co-reacting under plasma activated conditions typical glass making chemicals such as a calcium carbonate, sodium carbonate and oxides of silicon. Such chemicals may be brought into a reactive state by bombardment with a high energy beam of electrons.

The invention also includes within its scope an optical component formed by the method set forth.

According to another aspect of the invention an optical component having specular reflective properties comprises a plastics material having a face layer thereon of glass or a substance having glass like properties and a specular layer of reflective material coated thereon.

The invention may be performed in various ways and one specific embodiment will now be described by way of example.

In this example the plastics base material comprises a polycondensate polymer prepared by the interaction of a polyhydroxy compound with a carbonic acid derivative, typically the reaction product of bis-phenol-A with either phosgene or diphenyl carbonate which is available commercially under the Trade Name "Lexan" polycarbonate and manufactured by the General Electric Co. U.S.A. An appropriate shape and size may be obtained either by a conventional thermoplastics injection process or by cutting to a given, desired profile from precision manufactured extruded sheet.

The base material is vapour degreased in a fluorocarbon solvent, typically "Arklon" P (ICI) for three minutes, then transferred to an ultrasonically vibrated heated solution of the same solvent for a further three minutes for cleaning. A final vapour degreasing of three minutes duration may be given. The plastics material is then transferred to an appropriate location jig in a process vacuum vessel, this operation being carried out under strict conditions of cleanliness.

The vacuum vessel is sealed and pumped out to a pressure of $1 \times 10^{-5}$ mbar. Argon is then introduced until the pressure rises to $1 \times 10^{-1}$ mbar. A voltage of 1.5 kilovolts AC is then applied to electrodes situated within the vacuum vessel and in close proximity to the base plastics material surface which is to be processed. The glow discharge so initiated is held for a period of up to 20 minutes during which the plastics surface receives a "molecular cleaning" and which treatment in effect although termed cleaning provides a surface treatment which makes it more receptive to receive the coating layer as described below.

After the molecular cleaning a reactive oxidation process to provide a key coat face layer is carried out as follows. The vessel is re-pumped to $1 \times 10^{-5}$ mbar pressure and argon gas is introduced until the pressure reaches $5 \times 10^{-4}$ mbar. Oxygen is then added until the pressure has risen to $2 \times 10^{-3}$ mbar.

A magnetron sputtering operation using a chromium target is then initiated within the vacuum chamber and the charged chromium atoms interact reactively with oxygen so as to deposit the ley coat layer of chromium oxides onto the surface of the adjacent polycarbonate. This layer consists of one or more oxides of chromium and possibly also the metal itself. The layer is preferably 0.5–1.0 microns thick.

The oxygen supply is then discontinued and a conventional DC magnetron sputtering of chromium initiated at target power density levels which gradually increase from 4 W/cm$^2$ to 12 W/cm$^2$. This gradual deposition of chromium onto the chromium oxide key coat layer ensures that a stress-free film is deposited. It is known in the art that thin layers of chromium are prone to either compressive or tensile stresses and care is necessary at this stage. Typically a reflective layer thickness of from 0.5 to 5.0 microns is applied.

Although the invention has been described with reference to chromium oxides and a chromium multi-layer system it is not limited thereto.

For example a more highly relfective aluminum mirror can be produced in a similar manner with a reactively sputtered aluminum layer which would be similar to the chromium layer and consist of aluminum oxides and possible aluminium metal itself, followed by a layer of aluminum metal. In the case of a softer metal such as this, it may be necessary to apply a hard abrasion resistant top coat of a dielectric oxide such as an oxide of silicon either by sputtering with the assistance of an RF field or by an electron beam evaporation. Both techniques are well known to those skilled in the art. A typical thickness range for this top coat would be 0.5 to 5.0 microns.

Alternatively the glass or glass-like top coat layers may be formed in a variety of ways such as by means of an in situ glass making operation by co-reacting under plasma activation conditions typical glass making chemicals such as calcium carbonate, sodium carbonate and oxides of silicon. By this method conventional calcium/sodium/silicon glass may be formed on the surface of the plastics material. Alternatively alumino/silicon glass films and lead glass films can also be made in a similar way. Another method for depositing a glass layer is by the direct in vacuo vaporization of an already formed glass material e.g. borosilicate glass using electron beams or conventional electrical heating devices to induce vaporization.

It is also possible to use so called filled plastics material such as glass-filled, talc and chalk-filled, or other mineral filled polypropylene materials. Although these fillers are primarily designed to reduce cost and improve properties, the filler component can be co-reacted with substances in a vacuum chamber to improve bonding of the glass anchor coating.

What is claimed is:

1. A method of making an optical component having an abrasion resistant specular reflective finish on a plastics material comprising subjecting the plastics material to a degreasing operation by vapor degreasing in a fluorocarbon solvent and then transferring the plastics material to an ultrasonically vibrated heated solution of the same solvent, performing a molecular cleaning operation on the plastics material, applying a layer to the plastics material, said layer comprising a material selected from the group consisting of glass and metal oxides of the metal to be used as the specular reflective material, said layer being applied in a vacuum vessel in an atmosphere of oxygen and argon, and being applied to a thickness of between about 0.5 and about 1.0 microns, and subsequently applying a coating of specular reflective material to the layer, said coating being between about 0.5 and about 5.0 microns thick thereby producing said abrasion resistant specular reflective finish on said plastics material.

2. A method as claimed in claim 1 in which the metal used as the specular reflective material is selected from the group consisting of:
    (a) chromium, in which case the said layer applied to the plastics material is selected from the group consisting of glass and chromium oxides; and
    (b) aluminum, in which case the said layer applied to the plastics material is selected from the group consisting of glass and aluminum oxides.

3. A method as claimed in claim 2 in which the layer of oxide is applied by means of a magnetron sputtering operation in a vacuum vessel in an atmosphere of oxygen and argon at a pressure in the region of $2 \times 10^{-3}$ mbar.

4. A method as claimed in claim 3 in which immediately after the molecular cleaning the vacuum vessel is reduced to about $1 \times 10^{-5}$ mbar pressure argon gas is introduced until the pressure reached about $5 \times 10^{-4}$ mbar oxygen then being added until the pressure has risen to about $2 \times 10^{-3}$ mbar.

5. A method as claimed in claim 4 in which the layer of oxide is built up to the said thickness of between about 0.5 and 1.0 microns by means of a magnetron sputtering operation using a target of the metal to be deposited to form said layer.

6. A metod as claimed in claim 5 in which the coating of reflective material is applied directly to the said layer.

7. A method as claimed in claim 6 in which the reflective material is applied by a DC magnetron sputtering operation using target power density levels increased gradually from about 4 W/cm$^2$ to 12 W/cm$^2$ until the layer thickness of 0.5 to 5.0 microns is achieved.

8. A method as claimed in claim 7 in which the coating of a specular reflective material is chromium to a thickness of about 0.5 to 5.0 microns.

9. A method as claimed in claim 7 in which the coating of specular reflective material is aluminum.

10. A method as claimed in claim 9 in which a hard abrasion resistant top coat is applied to the aluminum by sputtering with the assistance of a R.F. field.

11. A method as claimed in claim 10 in which the top coat comprises a layer of dielectric oxide of between about 0.5 and 5.0 microns thick.

12. A method as claimed in claim 9 in which a hard abrasion resistant top coat is applied to the aluminum by electron beam evaporation.

13. A method as claimed in claim 1 in which the layer having hard glass like properties is applied in a vacuum vessel by means of electron beam evaporation.

14. A method as claimed in claim 1 in which the reflective material is applied by a DC magnetron sputtering operation using target power density levels increased gradually from about 4 W/cm$^2$ to about 12 W/cm$^2$ until the desired coating thickness is achieved.

* * * * *

UNITED STATES PATENT AND TRADEMARK OFFICE
CERTIFICATE OF CORRECTION

PATENT NO.   : 5,009,761
DATED        : April 23, 1991
INVENTOR(S)  : Dennis W. Robinson It is certified that error appears in the above-identified patent and that said Letters Patent is hereby corrected as shown below:

Column 3, line 12, change "proximinity" to --proximity--.

Column 3, line 29, change "ley" to --key--.

Column 3, line 47, change "relfective" to --reflective--.

Column 4, line 49, after "pressure" insert --and--.

Column 4, line 58, change "metod" to --method--.

Signed and Sealed this

Twenty-fourth Day of November, 1992

Attest:

DOUGLAS B. COMER

*Attesting Officer*    Acting Commissioner of Patents and Trademarks